United States Patent
Ichikawa et al.

(10) Patent No.: US 9,730,311 B2
(45) Date of Patent: Aug. 8, 2017

(54) DEVICE HAVING HEAT SINK

(71) Applicant: MITSUBISHI HEAVY INDUSTRIES AUTOMOTIVE THERMAL SYSTEMS CO., LTD., Kiyosu-shi, Aichi (JP)

(72) Inventors: Gento Ichikawa, Tokyo (JP); Takayuki Hagita, Kiyosu (JP); Akinori Yoshioka, Kiyosu (JP); Hiroyuki Kamitani, Kiyosu (JP); Koji Nakano, Tokyo (JP); Masayuki Ishikawa, Tokyo (JP); Masanori Takahashi, Tokyo (JP); Kenji Aoyagi, Tokyo (JP); Masato Ito, Tokyo (JP)

(73) Assignee: MITSUBISHI HEAVY INDUSTRIES AUTOMOTIVE THERMAL SYSTEMS CO., LTD., Aichi (JP)

( * ) Notice: Subject to any disclaimer, the term of this patent is extended or adjusted under 35 U.S.C. 154(b) by 198 days.

(21) Appl. No.: 14/443,896

(22) PCT Filed: Oct. 25, 2013

(86) PCT No.: PCT/JP2013/006328
§ 371 (c)(1),
(2) Date: May 19, 2015

(87) PCT Pub. No.: WO2014/080572
PCT Pub. Date: May 30, 2014

(65) Prior Publication Data
US 2015/0319839 A1 Nov. 5, 2015

(30) Foreign Application Priority Data
Nov. 21, 2012 (JP) .................................. 2012-254896

(51) Int. Cl.
H05K 7/20 (2006.01)
H02K 11/00 (2016.01)
(Continued)

(52) U.S. Cl.
CPC ............ *H05K 1/0203* (2013.01); *F04B 27/10* (2013.01); *F04B 35/04* (2013.01); *F04B 39/06* (2013.01);
(Continued)

(58) Field of Classification Search
CPC ......... H02K 11/00; H02K 11/33; F04B 39/00; F04B 39/06; F25B 2600/021; H05K 7/2089; H05K 7/209
(Continued)

(56) References Cited

U.S. PATENT DOCUMENTS 5,285,350 A * 2/1994 Villaume ............ H01L 23/3672
165/80.3
6,099,325 A * 8/2000 Parkhill ............... H01R 9/2466
361/707
(Continued)

FOREIGN PATENT DOCUMENTS

| JP | 8-7640 A | 1/1996 |
|---|---|---|
| JP | 10-241970 A | 9/1998 |

(Continued)

OTHER PUBLICATIONS

Chinese Office Action dated Apr. 6, 2016 issued in corresponding Chinese Application No. 201380059818.4 with an English Translation.

*Primary Examiner* — Burton Mullins
(74) *Attorney, Agent, or Firm* — Birch, Stewart, Kolasch & Birch, LLP

(57) ABSTRACT

An electric compressor includes a motor, a scroll compression mechanism, a housing, a circuit unit, a circuit housing
(Continued)

housing the circuit unit and integrated with the housing. The electric compressor includes a heat sink provided on a circuit unit side of a partition wall so as to project to be brought into contact with a semiconductor element of a power substrate, facing the partition wall that erects along a vertical direction to separate the inside of the housing from the circuit housing. The heat sink has a lower surface and an upper surface formed into a cylindrical shape so that width of an upper end portion and a lower end portion of the heat sink gradually decreases to reach a tip portion.

8 Claims, 8 Drawing Sheets

(51) Int. Cl.
  *H05K 1/02* (2006.01)
  *H02K 5/22* (2006.01)
  *F04C 18/02* (2006.01)
  *F04C 29/04* (2006.01)
  *F04B 39/06* (2006.01)
  *H02K 11/33* (2016.01)
  *F04B 27/10* (2006.01)
  *F04B 35/04* (2006.01)
  *H02K 9/22* (2006.01)

(52) U.S. Cl.
  CPC ........ *F04C 18/0215* (2013.01); *F04C 29/047* (2013.01); *H02K 5/225* (2013.01); *H02K 11/33* (2016.01); *F04C 2240/808* (2013.01); *H02K 9/22* (2013.01)

(58) Field of Classification Search
  USPC ............................... 361/702, 709; 310/64, 89
  See application file for complete search history.

(56) References Cited

U.S. PATENT DOCUMENTS

| | | | | |
|---|---|---|---|---|
| 7,569,957 | B2* | 8/2009 | Aoki | H01L 23/473 |
| | | | | 310/52 |
| 2005/0156472 | A1* | 7/2005 | Franzolini | H02K 11/33 |
| | | | | 310/64 |
| 2006/0108884 | A1 | 5/2006 | Shiino et al. | |
| 2009/0155101 | A1 | 6/2009 | Fukasaku et al. | |
| 2010/0253162 | A1* | 10/2010 | Sakamaki | B25D 16/00 |
| | | | | 310/50 |
| 2011/0175470 | A1 | 7/2011 | Kinoshita et al. | |
| 2013/0003306 | A1* | 1/2013 | Oota | B60R 16/0239 |
| | | | | 361/709 |
| 2013/0170136 | A1* | 7/2013 | Roby | H05K 7/205 |
| | | | | 361/692 |
| 2013/0257232 | A1* | 10/2013 | Tomizawa | H02K 29/08 |
| | | | | 310/68 R |

FOREIGN PATENT DOCUMENTS

| | | |
|---|---|---|
| JP | 2005-50906 A | 2/2005 |
| JP | 2008-163765 A | 7/2008 |
| JP | 2009-150235 A | 7/2009 |
| JP | 2010-144607 A | 7/2010 |
| JP | 5030551 B2 | 9/2012 |
| JP | 2012-211533 A | 11/2012 |

* cited by examiner

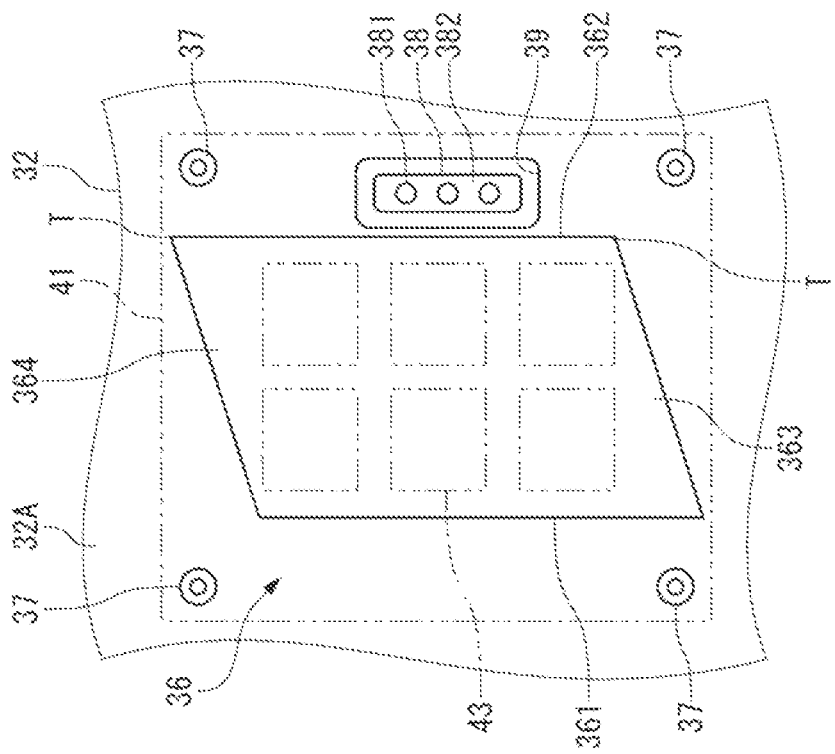
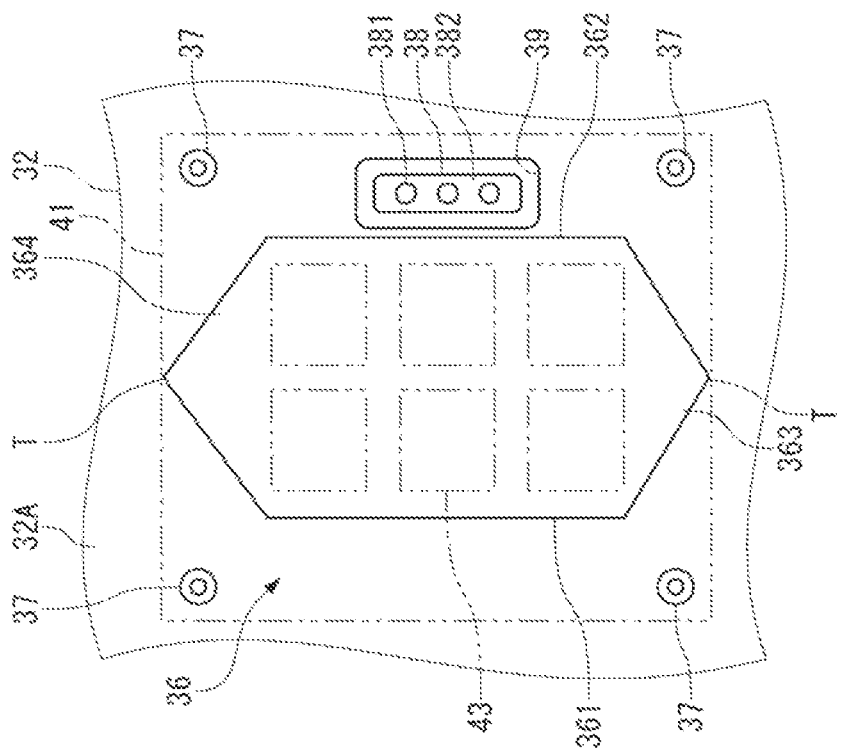

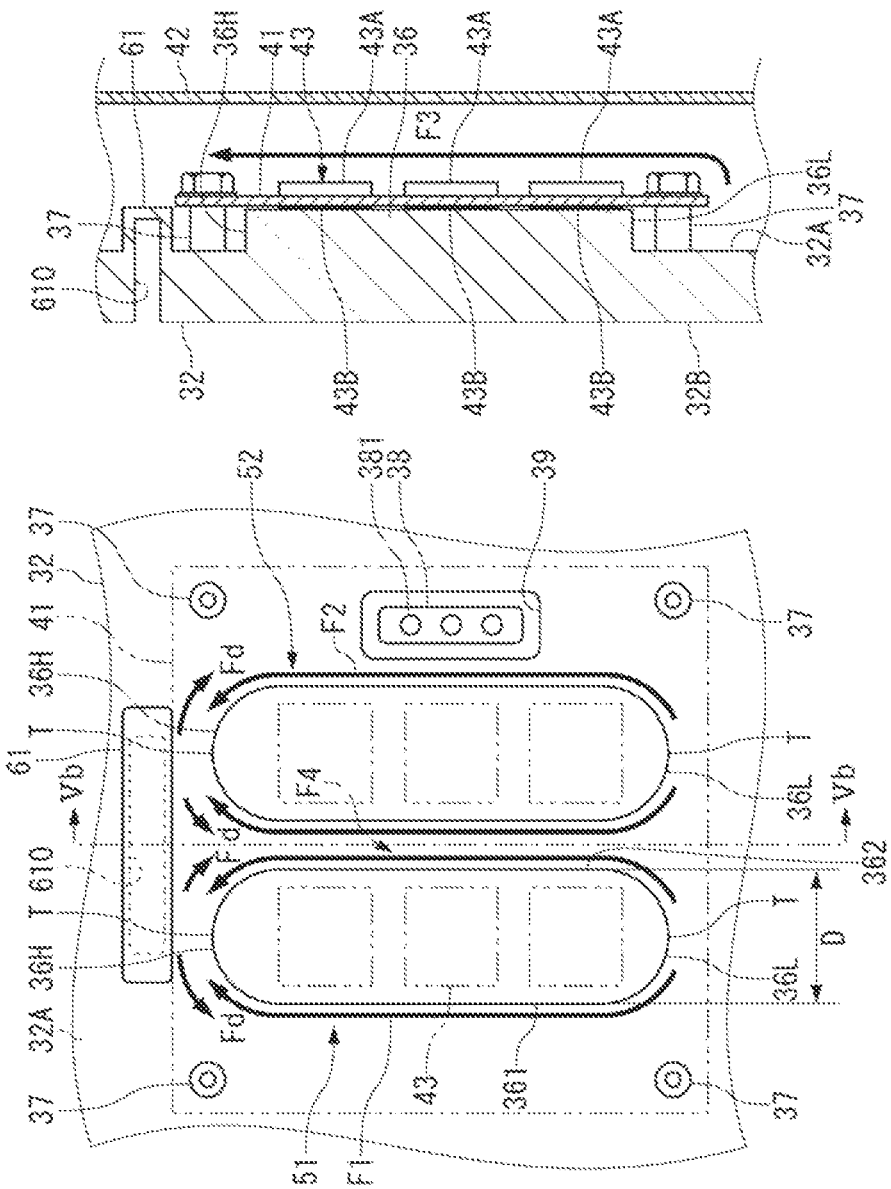

DEVICE HAVING HEAT SINK

TECHNICAL FIELD

The present invention relates to an apparatus that has a heat sink to dissipate heat of an element of a circuit unit.

BACKGROUND ART

In recent years, an electric compressor driven by a motor has been developed to be used in an air conditioner of a vehicle such as an electric vehicle, a hybrid vehicle, and a fuel cell vehicle. Rotation speed of the motor is generally controlled by a motor driving circuit unit using a semiconductor switching element. The semiconductor element has a large heating value, so that it is required to appropriately dissipate heat. Thus, a variety of proposals like the following have been provided.

Patent Literature 1 describes an electric compressor for an air conditioner of a vehicle, in which an axis of a motor and a compression mechanism is set horizontally. The electric compressor includes a housing having an upper surface with which a box-like inverter housing section is integrated. The box-like inverter housing section is provided in its bottom face with block-like heat sinks divided in accordance with arrangement of semiconductor elements. When a metal plate integrated with a circuit board provided with the semiconductor elements is arranged horizontally on a boss provided in the bottom face of the inverter housing section to be fixed thereto, the semiconductor elements are brought into contact with the respective heat sinks. Accordingly, heat generated by the semiconductor elements is dissipated into a refrigerant at a low temperature to be sucked into the housing through the heat sinks. Since there are the divided heat sinks, each of the semiconductor elements is uniformly cooled.

Patent Literature 2 also describes an electric compressor in which heat of a semiconductor element is dissipated into a refrigerant to be sucked into a housing. In Patent Literature 2, a circuit board is arranged so as to be perpendicular to an axis of a motor and a compression mechanism that is set horizontally, and one side of the circuit board is brought into close contact with a wall of the housing. In addition, the housing that houses the circuit board is provided with an intake port and an exhaust port for ventilation of inside air and outside air, so that warmed air inside the housing is discharged through the exhaust port to prevent heat accumulation inside the housing.

Further, in Patent Literature 2, a thermo-module facing the other side of the circuit board is provided as an auxiliary cooling device. The thermo-module includes a Peltier element and a radiating fin, and heat absorbed in the Peltier element by energization of the Peltier element is dissipated to the outside of the housing through the radiating fin.

CITATION LIST

Patent Literature

Patent Literature 1
  Japanese Patent No. 5030551
Patent Literature 2
  Japanese Patent Laid-Open No. 2008-163765

SUMMARY OF INVENTION

Technical Problem

An electric compressor for a vehicle is greatly required to be reduced in size and weight from a viewpoint of mounting space, increase in a travel distance, and the like. Thus, a motor driving circuit unit is generally housed in a housing integrated with a housing for accommodating a motor and a compression mechanism as described in Patent Literatures 1 and 2. In such a small-sized compressor, the volume of a circuit housing is reduced to a minimum to cause high heat density in the housing. Thus, heat dissipation by only conduction of heat of a semiconductor element through a member in contact with the semiconductor element is insufficient, so that it is required to actively dissipate heat of the semiconductor element.

Unfortunately, although a structure of Patent Literature 1 is configured to allow the semiconductor elements to be uniformly cooled, air whose temperature rises due to heat generated by the semiconductor elements easily stays in a space between an upper surface of the circuit board and the cover because the circuit board is arranged horizontally so as to face a cover with which an opening of the inverter housing section is covered. Thus, there is a possibility that heat dissipation of the semiconductor elements may be obstructed.

On the other hand, according to a structure of Patent Literature 2, although residence of heated air is reduced due to application of a ventilation structure, ventilation allows water, dust, and the like to easily enter the circuit housing through an opening for ventilation. In addition, forced cooling means using electricity is used, so that power consumption increases. As a result, there is a possibility that a traveling range of a vehicle using electricity as a power source may decrease.

Thus, it is an object of the present invention to efficiently cool a circuit element by using natural convection in a circuit housing without requiring ventilation between the inside of the circuit housing and the outside thereof, as well as forced cooling means using power.

Solution to Problem

An apparatus of the present invention includes an apparatus body, a body housing that houses the apparatus body, a circuit unit including a circuit board that drives and controls the apparatus body, and a circuit housing that houses the circuit unit and that is integrated with the body housing.

The present invention includes a heat sink that is provided on a circuit unit side of a partition wall so as to be brought into contact with an element of the circuit board, the partition wall erecting along a vertical direction or a substantially vertical direction to separate the inside of the body housing from the inside of the circuit housing, and the heat sink has an upper end portion and a lower end portion at least one of whose width gradually decreases to reach a tip portion (tip).

The "vertical direction" in the present invention is defined as a direction in a state where the apparatus is installed (usage state). Here, a direction slightly deviated from the vertical direction depending on an assembling tolerance, a posture of an installation object (such as a vehicle), and the like, is allowable. Hereinafter, the "vertical direction" in the description below includes a substantially vertical direction that is slightly deviated from the vertical direction.

The partition wall separating the inside of the body housing from the inside of the circuit housing is set at a temperature lower than that of the heat sink due to a heat capacity of the body housing, and cooling by fluid in the body housing at a temperature lower than a temperature in the circuit housing. Heat of the heat sink is dissipated by heat exchange for air in a periphery of the heat sink that is set at a low temperature due to heat conduction from the partition wall, or radiation from the partition wall.

Here, the present invention uses natural convection to maintain air in the periphery of the heat sink at a low temperature to promote heat dissipation of the heat sink. The circuit board facing the partition wall erecting along the vertical direction also erects along the vertical direction, so that air whose temperature rises due to heat generation of the element moves upward along the circuit board through the side of the heat sink. Accordingly, it is expected that air in the periphery of the heat sink is maintained at a low temperature due to natural convection caused by density difference between an ascending current of the air and a descending current at a temperature lower than that of the ascending current.

Unfortunately, natural convection smoothly and efficiently occurs in a section along the vertical direction of air current flowing along the heat sink in a space between the circuit board and the partition wall, however, air easily stays in the upper end portion and the lower end portion of the heat sink intersecting the vertical direction to cause heated air to accumulate, so that heat dissipation of the heat sink is obstructed.

In order to prevent the problem above, it is configured to allow at least one of the upper end portion and the lower end portion of the heat sink to gradually decrease in width to reach the tip portion. In this way, since the heat sink is formed with a height gradient, it is possible to secure natural convection based on a density difference also in the upper end portion or the lower end portion of the heat sink. Accordingly, it is possible to prevent a heat transfer rate between the heat sink and peripheral air in accordance with the natural convection from decreasing in the upper end portion and the lower end portion of the heat sink. As a result, a cooling effect of the natural convection is exerted throughout upper and lower portions of the heat sink to enable air in the periphery of the heat sink to be maintained at a low temperature. Thus, while heat of the heat sink is transferred to low-temperature air in the periphery of the heat sink, the heat of the element can be efficiently dissipated into the heat sink.

According to the present invention, since the element of the circuit board is efficiently cooled, it is possible to arrange the element at higher-density. Accordingly, it is possible to promote downsizing of an apparatus.

In addition, according to the present invention, since the cooling effect of the natural convection is sufficiently exerted, a sufficient cooling effect can be acquired without requiring another cooling means such as ventilation between the inside and outside of the circuit housing, and forced cooling means. As a result, it is possible to reduce costs required for cooling an element.

In an apparatus of the present invention, it is preferable that the heat sink has a dimension in the vertical direction that is longer than a dimension in a direction intersecting the vertical direction.

Accordingly, with respect to a length of a section along the vertical direction in which the heat transfer rate is high due to the natural convection, a length of a section with a heat transfer rate lower than that in the section along the vertical direction can be reduced. As a result, it is possible to further enhance the cooling effect of the natural convection.

In the apparatus of the present invention, it is preferable that a plurality of the elements is arranged on the circuit board at least in a horizontal direction, and that the heat sink is provided for each of blocks into which an area where the elements are arranged is divided along the vertical direction.

If the heat sink is divided so that a plurality of the heat sinks shares the area where the elements are arranged, a heating area to be brought into contact with peripheral air increases to improve heat dissipation of the heat sink. In addition, since a direction of division is the vertical direction, convection smoothly occurs between the heat sinks adjacent to each other. As a result, it is possible to further improve the heat dissipation of the heat sink.

Each of the heat sinks divided along the vertical direction decreases in width as compared with an integrated heat sink, so that an aspect ratio increases. Accordingly, with respect of a length of a section in a longitudinal direction (vertical direction), a length of a section with a heat transfer rate lower than that of the section in the longitudinal direction can be further reduced. As a result, this point also can contribute to improvement in the heat dissipation of the heat sink.

In the apparatus of the present invention, it is preferable that a projected portion is formed in the partition wall so as to project above the heat sink toward the circuit unit.

Accordingly, since the projected portion faces an air current rising along the heat sink, an ascending current is cooled by the projected portion to turn to descend. In this way, if an air current descending is promoted, convection is promoted, too. Thus, it is possible to further improve the heat dissipation of the heat sink and the element.

In the apparatus of the present invention, it is also possible that the projected portion is formed so as to include a recessed portion that communicates with the inside of the body housing.

Since the projected portion is cooled by fluid in the body housing flowing into the recessed portion, the projected portion can be maintained at a temperature equivalent to that of the partition wall. The projected portion allows many descending currents to occur to enable convection to be promoted.

In addition, in the recessed portion, a terminal connecting the circuit board and the apparatus body can be housed. In this way, since the recessed portion also serves as an opening of a terminal housing, the number of members occupying the inside of the circuit housing decreases to allow air to smoothly circulate in the circuit housing. As a result, it is possible to enhance the cooling effect.

In the apparatus of the present invention, it is preferable that a fixed portion for fixing the circuit board to the partition wall is formed integrally with at least one of the heat sink and the projected portion.

Accordingly, the number of members occupying the inside of the circuit housing can be further reduced. In addition, since the fixed portion is thermally connected to the heat sink and the projected portion to increase the heat capacity, the heat dissipation of the heat sink and the projected portion is improved. Further, since heat transfer from the circuit board through the fixed portion can be expected, it is possible to contribute to improvement in the heat dissipation of the element.

It is preferable that the apparatus of the present invention is an electric compressor. The apparatus body includes a motor, and a compression mechanism that is driven and controlled through the motor and that compresses a refrigerant to be sucked into the body housing.

A refrigerant gas at a low temperature and a low pressure, sucked into the body housing, cools the partition wall so that the partition wall is maintained at a low temperature. Since heat of the heat sink and the element is dissipated by using convection with low-temperature air cooled by the partition wall, it is possible to enhance the cooling effect.

Advantageous Effects of Invention

According to the apparatus of the present invention, it is possible to efficiently cool the circuit element by using the natural convection in the circuit housing.

BRIEF DESCRIPTION OF THE DRAWINGS

FIG. 2 schematically shows a cooling structure in the first embodiment.

Each of FIGS. 3A and 3B shows an example of a variation of the first embodiment.

Figure 4A:
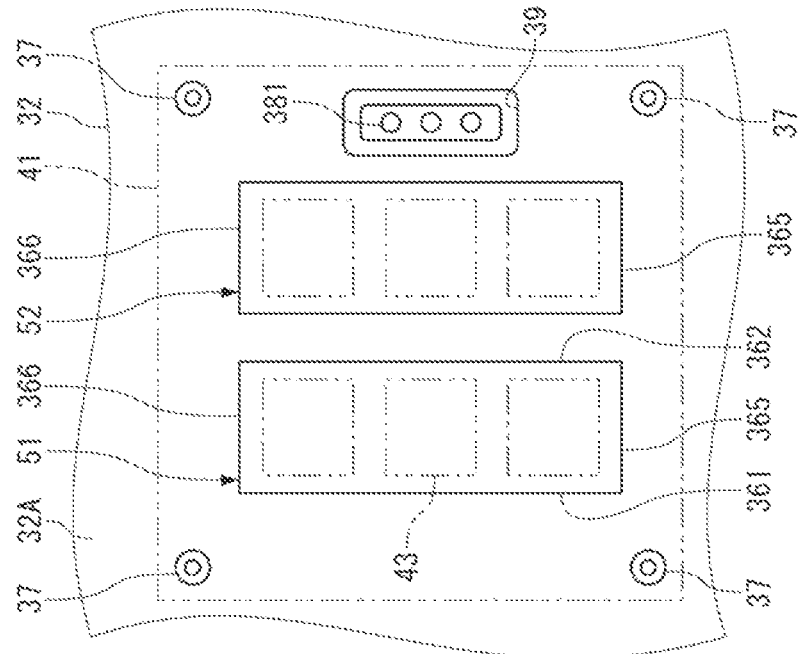
Figure 4B:
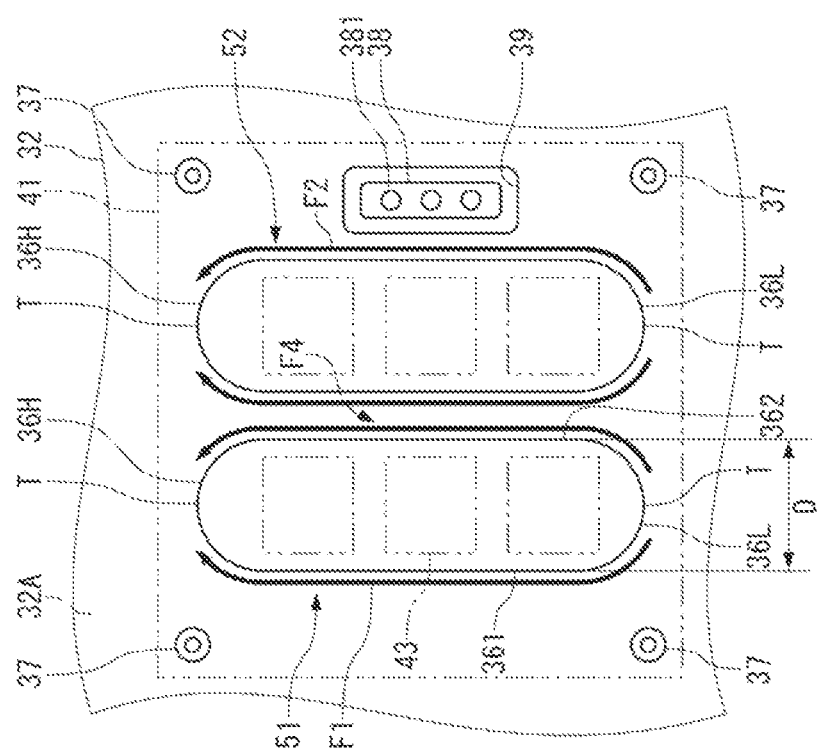

FIG. 4A is a plan view schematically showing a cooling structure in a second embodiment. FIG. 4B is a plan view schematically showing an example of a variation of the second embodiment.

FIG. 5 schematically shows a cooling structure in a third embodiment. FIG. 5A is a plan view, and FIG. 5B is a sectional view taken along the line Vb-Vb of FIG. 5A.

Figure 6:
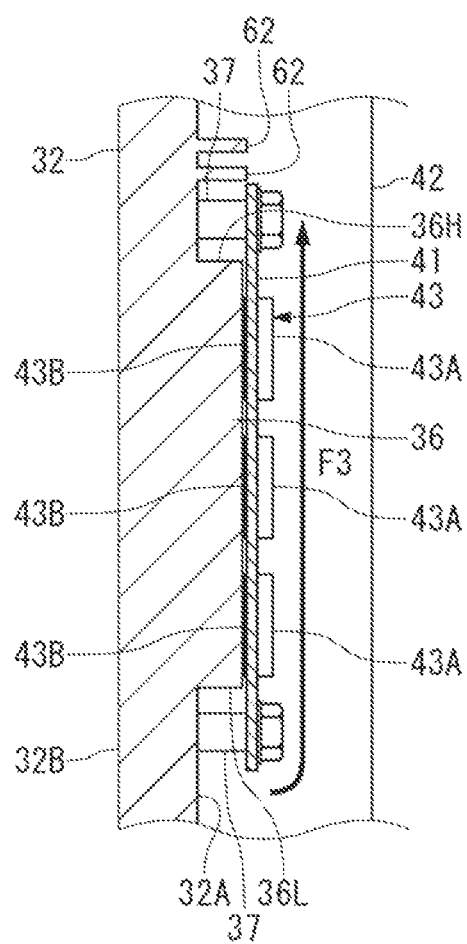

FIG. 6 is a sectional view schematically showing a cooling structure in an example of a variation of the third embodiment.

Figure 7:
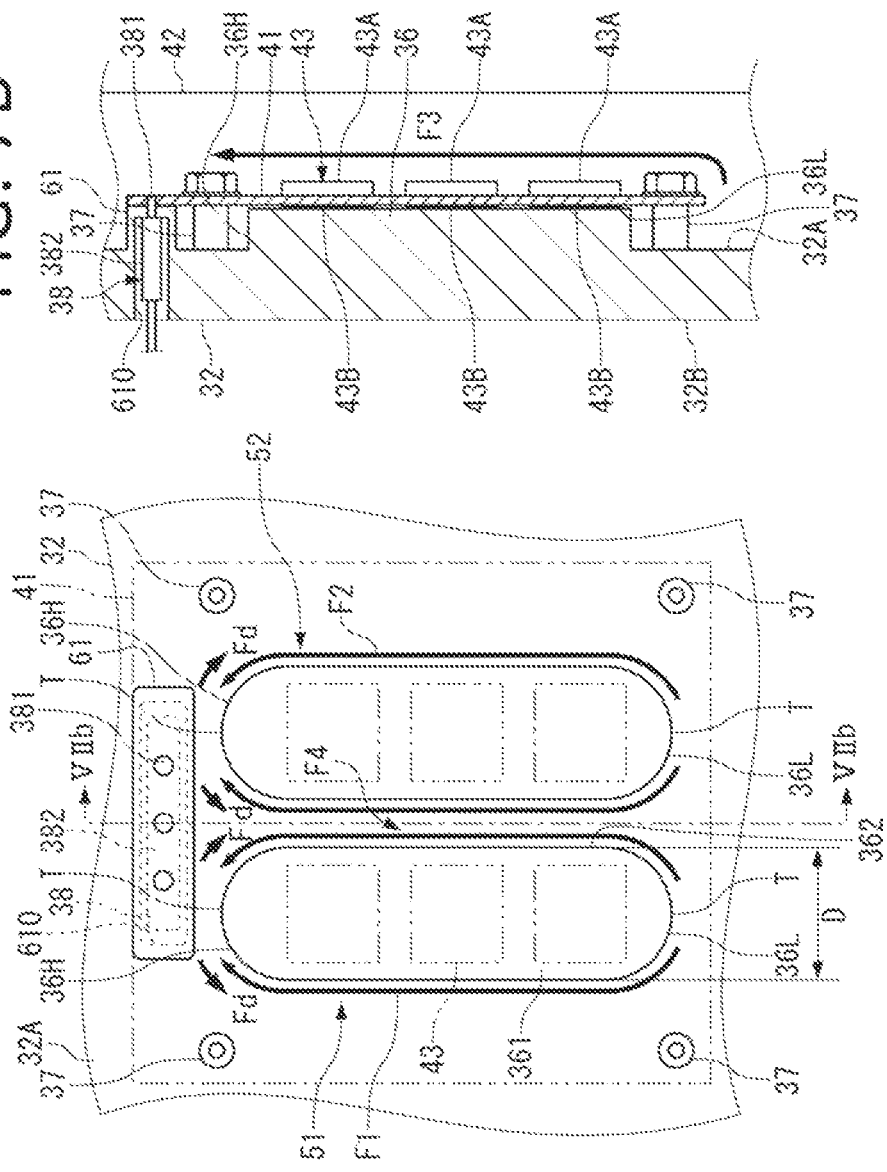

FIG. 7 schematically shows a cooling structure in a fourth embodiment. FIG. 7A is a plan view, and FIG. 7B is a sectional view taken along the line VIIb-VIIb of FIG. 7A.

Figure 8:
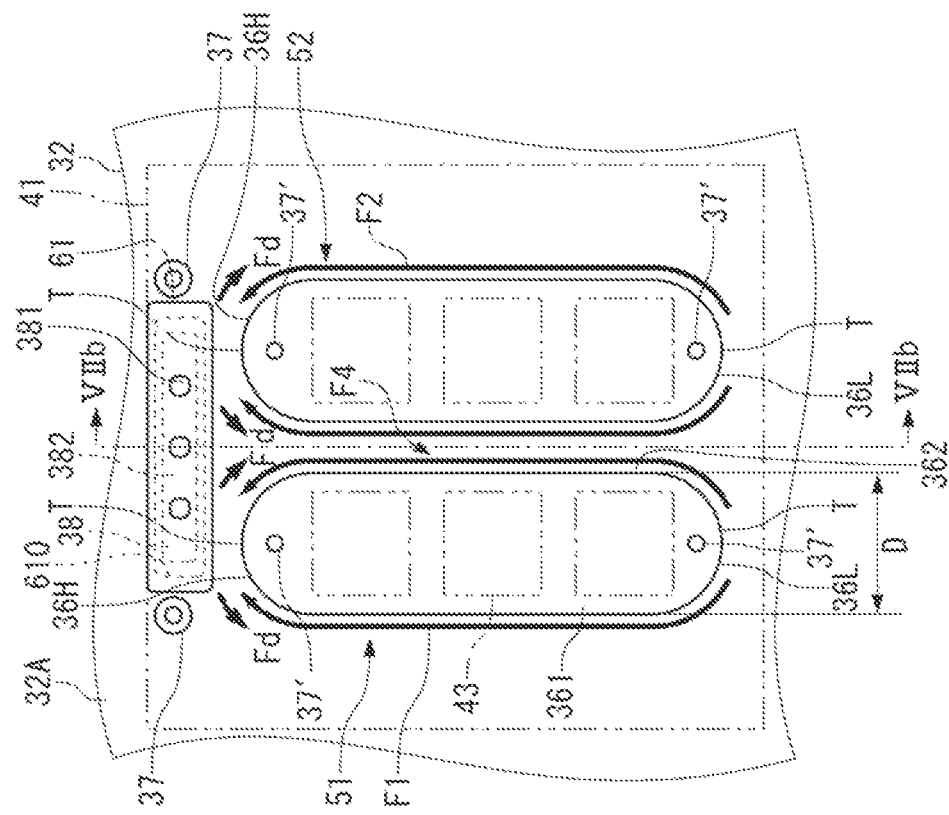

FIG. 8 is a plan view schematically showing a cooling structure in an example of a variation of the fourth embodiment.

DESCRIPTION OF EMBODIMENTS

Hereinafter, the embodiments of the present invention will be described in detail with reference to the accompanying drawings.

[First Embodiment]

Figure 1:
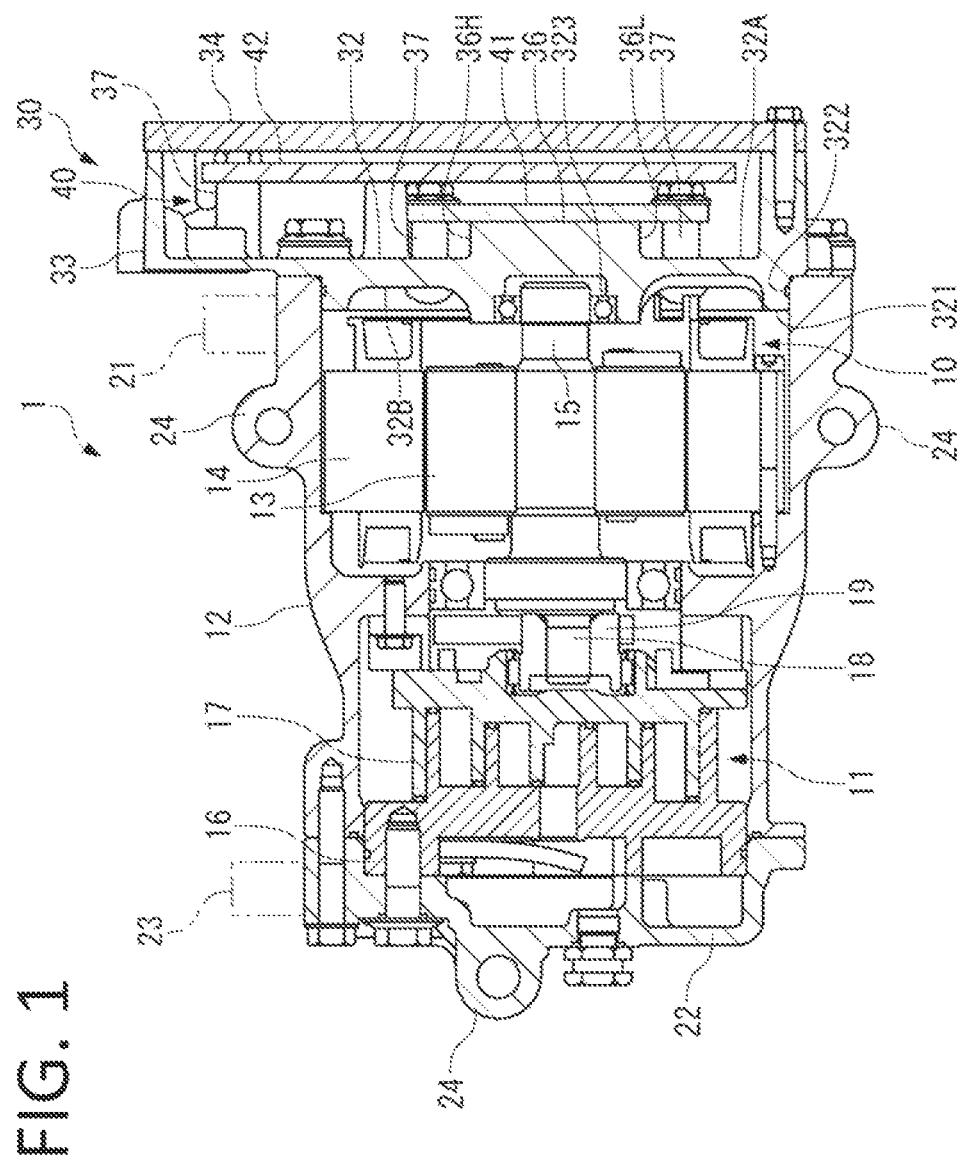
FIG. 1 is a longitudinal sectional view of an electric compressor in accordance with a first embodiment.

An electric compressor 1 shown in FIG. 1 constitutes an air conditioner to be mounted in a vehicle. The electric compressor 1 includes a motor 10, a scroll compression mechanism 11 that is rotated by output of the motor 10, a housing (body housing) 12 that accommodates the motor 10 and the scroll compression mechanism 11, a circuit housing 30 that houses a circuit unit 40 that drives and controls the motor 10 and that is integrated with the housing 12.

The electric compressor 1 is provided in a vehicle so that a rotating shaft 15 thereof to be rotated by the motor 10 is arranged in a horizontal direction.

The motor 10 includes a rotor 13, and a stator 14. Rotation of the rotor 13 is outputted to the rotating shaft 15. In the present embodiment, although an AC induction motor is used as the motor 10, a motor is not limited to the above. For example, a DC brushless motor, a switched reluctance motor, and the like, are applicable.

The scroll compression mechanism 11 includes a fixed scroll 16 that is to be fixed to the housing 12, and turning scroll 17 that is provided around an eccentric pin 18 fastened to the rotating shaft 15 through a bushing 19. The turning scroll 17 is revolved around the fixed scroll 16 with rotation of the rotating shaft 15.

The housing 12 is formed into a substantially cylindrical shape so as to enclose the motor 10 and the scroll compression mechanism 11 by die casting using an aluminum alloy or the like. The housing 12 is provided with a plurality of fixed portions 24 that are to be fastened to a support member (not shown) provided in the vehicle.

On one end side of the housing 12 where the motor 10 is positioned, there is provided a suction pipe 21 for sucking a refrigerant from a refrigerant circuit of the air conditioner into the housing 12. The inside of the housing 12 is sealed by a partition wall 32 that is provided on the one side of the housing 12 to separate the inside of the housing 12 from the inside of the circuit housing 30, and a cover member 22 provided on the other end side of the housing 12.

The refrigerant sucked into the housing 12 through the suction pipe 21 circulates throughout the inside of the housing 12 through a periphery of the motor 10 and a ventiduct (not shown) provided in the stator 14 to be sucked into the scroll compression mechanism 11. The refrigerant that is compressed by the scroll compression mechanism 11, and that is discharged into a chamber formed between an end plate of the fixed scroll 16 and the cover member 22, is then discharged to the refrigerant circuit through a discharge pipe 23 provided in the cover member 22.

The circuit housing 30 houses a circuit board and a circuit element that constitute the circuit unit 40, and includes the partition wall 32 positioned on one end side of the housing 12 in the horizontal direction, and a sidewall 33 rising from an outer peripheral edge of the partition wall 32. The circuit housing 30 is formed into a box shape, and is fastened to the housing 12 to be integrated with the housing 12. The circuit housing 30 is also formed by die casting using an aluminum alloy or the like.

The partition wall 32 is provided so as to be perpendicular to the rotating shaft 15. When the electric compressor 1 is mounted in the vehicle, the partition wall 32 erects along the vertical direction. The partition wall 32 has an annular fitting portion 321 projecting from a surface (back surface 32B) facing the motor 10 that is fitted into an inner periphery of an end portion of the housing 12 through a seal ring 322.

The partition wall 32 is formed into a substantially circular shape along an outer periphery of the fitting portion 321, and a part of the partition wall 32 projects to an outer periphery side from the fitting portion 321.

In addition, a bearing 323 for supporting an end of the rotating shaft 15 is provided in a central portion of the partition wall 32 on the back surface 32B side.

In the partition wall 32, a terminal housing opening 39 into which a motor terminal (glass terminal) 38 (refer to FIG. 2A) to be connected to a terminal of the motor 10 in the housing 12 is inserted is formed so as to penetrate through the partition wall 32 in its thickness direction. The motor terminal 38 is configured to bring three phase terminals of the motor 10 into conduction by using three lead pins 381 while sealing the inside of the housing 12. Each of the lead pins 381 is connected to a terminal part of a power substrate 41. A body part 382 enclosing the lead pins 381 projects from a surface 32A of the partition wall 32 by a predetermined height.

In the surface 32A of the partition wall 32 (a surface on a side facing the circuit unit 40), there are provided a heat sink 36 with which a plurality of semiconductor elements provided in the circuit unit 40 is brought into contact to allow heat conduction, and a plurality of bosses 37 for fixing a circuit board of the circuit unit 40. A bolt penetrating the circuit board is fastened to each of the bosses 37. Any number of the bosses 37 and any position of each of the bosses 37 are applicable.

The sidewall 33 is formed at a height that allows a plurality of circuit boards constituting the circuit unit 40 to be housed. In the sidewall 33, a circuit cover 34 with which the circuit unit 40 is covered is fixed with a bolt.

The circuit unit 40 includes a power substrate 41 in which a circuit of an electric power system is mounted, a control substrate 42 that controls operation of the power substrate 41, and a bus bar (not shown) serving as wiring. Other than those above, the circuit unit 40 also includes: a capacitor, an inductor, and the like, which are not shown and are arranged aside of the power substrate 41 and the control substrate 42; a power source terminal (not shown) to be connected to a battery; and the like.

The circuit unit 40 may include not only one circuit board, but also three or more circuit boards. Any configuration of the circuit board is applicable to the circuit unit 40.

The power substrate 41 includes six semiconductor switching elements for electric power (hereinafter referred to as a semiconductor element) 43 (refer to FIGS. 2A and 2B) that constitute an inverter circuit. The power substrate 41 is formed in a substantially circular plate-like shape in agreement with the housing 12 in a substantially cylindrical shape, as with the partition wall 32. The same applies to the control substrate 42. The power substrate 41 and the control substrate 42 do not necessarily require a shape corresponding to the shape of the housing 12, and may be formed in a rectangular shape.

A circuit of the power substrate 41 constitutes a circuit that outputs a waveform of a driving current to be supplied to the motor 10. The circuit switches on/off the semiconductor element 43 on the basis of a command from the control substrate 42 to generate a three-phase current from a direct current supplied through the power source terminal. The three-phase current generated is supplied to coils of the motor 10.

Figure 2B:
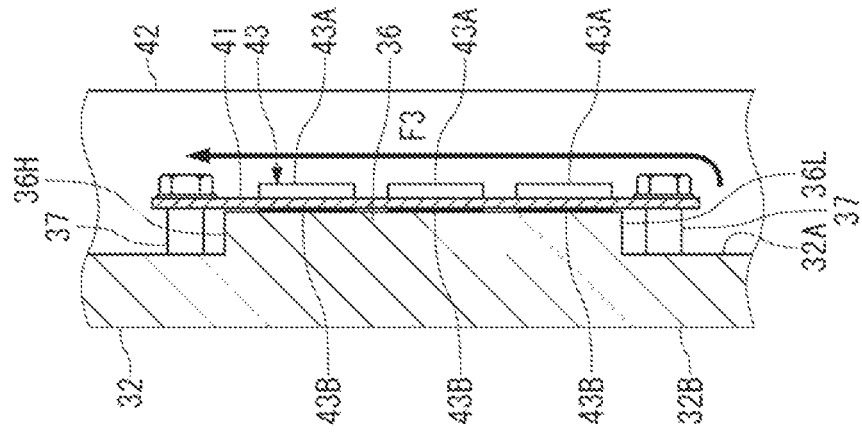
FIG. 2B is a sectional view taken along the line IIb-IIb of FIG. 2A.

The semiconductor element 43 is an Insulated Gate Bipolar Transistor (IGBT), or the like, and includes a rectangular element body 43A, and a radiating member 43B made of copper that is embedded in the power substrate 41, and that is arranged immediately below the element body 43A (refer to FIG. 2B). The radiating member 43B is a so-called copper inlay that is embedded in a substrate, and slightly projects to a back surface side of the power substrate 41 (refer to FIG. 2B).

The inverter circuit requires a pair of the semiconductor elements 43 for each of U-phase, V-phase, and W-phase, or a total of six semiconductor elements 43, and the semiconductor elements 43 are arranged by two columns in three rows corresponding to respective three phases. An area 410 of the power substrate 41, where the semiconductor elements 43 are arranged, is formed in a rectangular shape in which a dimension in a direction of the row (vertical direction) is longer than a dimension in a direction of the column (horizontal direction on the power substrate 41).

In the control substrate 42, control integrated circuit (IC) that is not shown is provided. The control IC transmits a command to the power substrate 41 on the basis of a pressure and a temperature of the refrigerant in the housing 12, an indoor temperature of the vehicle, an outdoor temperature, and the like, which are detected. Accordingly, an appropriate driving waveform of the motor 10 is generated.

Figure 2A:
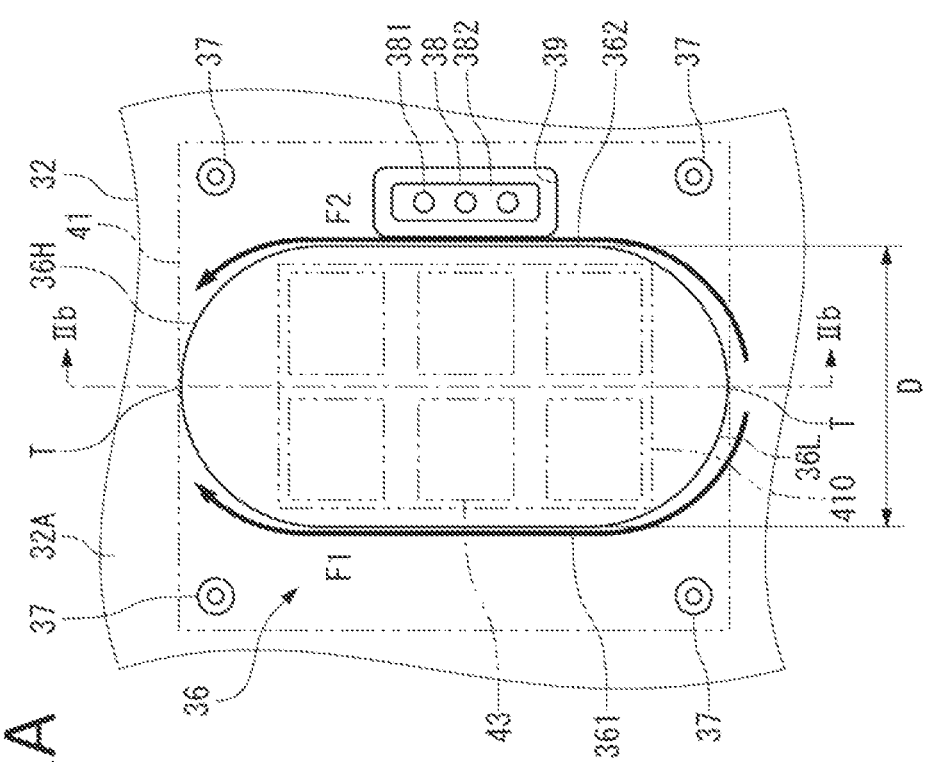
FIG. 2A is a plan view.

Hereinafter, the heat sink 36 constituting a cooling structure of the semiconductor elements 43 will be described with reference to FIGS. 2A and 2B. In FIG. 2A, the power substrate 41 is schematically shown in a rectangular shape.

As described above, the heat sink 36 is formed so as to project from the surface 32A of the partition wall 32 erecting along the vertical direction in the horizontal direction.

When four corners of the power substrate 41 (shown by a two-dot chain line) are fixed to the respective bosses 37 of the partition wall 32, the power substrate 41 also erects along the vertical direction. At this time, the heat sink 36 overlaps throughout the area 410 where the six semiconductor elements 43 are arranged. Since the heat sink 36 projects from the partition wall 32 by a height same as that of each of the bosses 37 to which the power substrate 41 is fixed, the radiating member 43B of each of the semiconductor elements 43 is brought into contact with a surface of the heat sink 36 to allow heat conduction.

The control substrate 42 also erects along the vertical direction when being fixed to the bosses 37. Accordingly, the control substrate 42 faces the power substrate 41.

The heat sink 36 of the present embodiment is formed so that a length in the vertical direction is more than a width thereof. The width of the heat sink 36 (shown in FIG. 2A indicated as D) is set to be equal to or more than a width of the area 410 where the semiconductor elements 43 are arranged (dimension in the direction of the column), and the length of the heat sink 36 is set to be equal to or more than a length of the area 410.

The heat sink 36 is formed in an oval block shape in a plan view, and includes a pair of a side surface 361 and a side surface 362 that are positioned aside of the heat sink 36, a lower surface 36L that connects the side surface 361 and the side surface 362 in a lower end of the heat sink 36, and an upper surface 36H that connects the side surface 361 and the side surface 362 in an upper end of the heat sink 36.

The lower surface 36L projects downward in an arc-like shape to form a cylindrical surface. The upper surface 36H projects upward in an arc-like shape to form a cylindrical surface. Each of the lower surface 36L and the upper surface 36H is formed so that a width D of the heat sink 36 gradually decreases toward a tip portion T positioned at the center of the width of the heat sink 36.

When the driving current generated by the circuit unit 40 is supplied to the motor 10, the electric compressor 1 is started up, so that a refrigerant to be sucked into the housing 12 through the suction pipe 21 is compressed by the scroll compression mechanism 11. During operation of the electric compressor 1, switching control is applied to the semiconductor elements 43 so that the semiconductor elements 43 continuously generate heat.

Heat generated from the element body 43A is conducted to the heat sink 36 through the radiating member 43B, thereby dissipating the heat.

Heat of the heat sink 36 is dissipated by heat exchange for air in the periphery of the heat sink 36 that is set at a low temperature due to heat conduction from the partition wall 32 with which a sucked refrigerant is brought into contact, or radiation from the partition wall 32.

Here, natural convection is used to maintain air in the periphery of the heat sink 36 at a low temperature to promote heat dissipation of the heat sink 36.

In the present embodiment, the power substrate 41 erects along the vertical direction, so that the natural convection occurs along the power substrate 41. In accordance with the natural convection, in a space between the power substrate 41 and the partition wall 32, there are formed an air current F1 rising along the one side surface 361 of the heat sink 36, and an air current F2 rising along the other side surface 362 of the heat sink 36. Also in a space between the power substrate 41 and the control substrate 42, a rising air current F3 is formed.

In addition, in a periphery of the power substrate 41, a descending air current is formed.

The air currents F1 to F3, and the descending air current allows air in the circuit housing 30 to circulate to dissipate heat of the heat sink 36 and the semiconductor element 43.

Here, natural convection caused by a density difference between heated air and cooled air adjacent to a lower side of the heated air does not occur in a state where the heated air and the cooled air exist along a horizontal surface. If the heat sink 36 is formed in a rectangular shape with lower and upper sides orthogonal to the side surfaces 361 and 362, natural convection smoothly occurs around the side surfaces 361 and 362 along the vertical direction, however, around the lower side and the upper side, residence of air occurs because a height gradient is zero. Around there, a heat transfer rate between the heat sink 36 and the air decreases.

Thus, the arc-like lower surface 36L and upper surface 36H in the heat sink 36 are formed so that both of the upper and lower ends of the heat sink 36 have a height gradient. As a result, natural convection occurs even around the lower surface 36L and the upper surface 36H of the heat sink 36.

Accordingly, it is possible to prevent a heat transfer rate in the upper end portion and the lower end portion of the heat sink 36 from decreasing. As a result, a cooling effect due to the natural convection is exerted throughout the heat sink around which the air currents F1 and F2 flow to enable air in the periphery of the heat sink to be maintained at a low temperature. Thus, while heat of the heat sink 36 is transferred to low-temperature air in the periphery of the heat sink 36, the heat of the semiconductor elements 43 can be efficiently dissipated into the heat sink 36.

As above, since the semiconductor elements 43 are efficiently cooled, it is also possible to arrange the semiconductor elements 43 and other circuit elements at higher-density. Downsizing of the circuit housing 30 due to the matter above can lead the electric compressor 1 to be downsized.

In addition, since a long section in the vertical direction where the heat transfer rate is high due to the natural convection is secured in the heat sink 36, the area 410 where the semiconductor elements 43 are arranged so that a dimension in the vertical direction is lengthened. Accordingly, a dimension of the heat sink 36 in the vertical direction is set to be longer than the width D. As a result, it is possible to further enhance the cooling effect due to the natural convection.

Any shape is applicable to the lower end portion and the upper end portion of the heat sink 36, as long as the width D gradually decreases to reach the tip portion T.

For example, as shown in FIG. 3A, a lower end portion 363 and an upper end portion 364 of the heat sink 36 may be formed in a wedge shape. Each of the lower end portion 363 and the upper end portion 364 is formed with a plane intersecting the side surface 361 and a plane intersecting the side surface 362 so as to project to the tip portion T in a chevron shape.

Alternatively, as shown in FIG. 3B, the lower end portion 363 and the upper end portion 364 also may be formed so that the width of the heat sink 36 gradually decreases to the tip portion T positioned at any one of ends in a width direction of the heat sink 36.

Although the tip portion T shown above constitutes a corner formed with two planes intersecting each other, the corner may be chamfered in a plane shape or a curved shape.

Although it is preferable that both of the lower end portion and the upper end portion of the heat sink 36 gradually decrease in width to tip portion T, the present invention allows a configuration in which only one of the lower end portion and the upper end portion gradually decreases in width to the tip portion T, and the other of them is formed so as to extend linearly along a direction intersecting the side surfaces 361 and 362.

The number of the semiconductor elements 43 and arrangement thereof can be arbitrarily configured depending on a type of the motor 10.

The heat sink 36 may be formed in any shape that can be overlapped with an area where the semiconductor elements 43 are arranged. The dimension of the heat sink 36 in the vertical direction is not necessarily required to be longer than a width of the heat sink 36, and the present invention allows also a heat sink in which a dimension in the vertical direction is shorter than a width of the heat sink.

In addition, in the present embodiment, although the element body 43A of each of the semiconductor elements 43 is in contact with the heat sink 36 through the radiating member 43B, the semiconductor element 43 without the radiating member 43B is directly brought into contact with the heat sink 36.

Further, in the present embodiment, although the scroll compression mechanism 11 is shown by example, another type of a compression mechanism such as a rotary type is applicable.

[Second Embodiment]

Next, a compressor of a second embodiment of the present invention will be described.

In the description below, a configuration different from the first embodiment will be mainly described, and a configuration identical with that described before is designated by the same reference numeral used before without duplicated description on the configuration.

As shown in FIG. 4A, in the second embodiment, two heat sinks 51 and 52 are used. The heat sinks 51 and 52 are formed by dividing the heat sink 36 of the first embodiment into two almost equal parts along the vertical direction. Accordingly, each of the heat sinks 51 and 52 provides heat dissipation of the semiconductor elements 43 by one column. That is, the heat sink 51 corresponds to a block in which the semiconductor elements 43 forming one of columns are arranged, and the heat sink 52 corresponds to a block in which the semiconductor elements 43 forming the other of the columns are arranged.

In each of the heat sinks 51 and 52, the lower surface 36L and the upper surface 36H are formed, as with the heat sink 36 described above. In addition, there is an interval between the heat sinks 51 and 52, where an air current F4 along the vertical direction occurs as with the air currents Fl and F2. Since the lower surface 36L and the upper surface 36H are formed, a width of each of the heat sinks 51 and 52 gradually decreases to increase a flow channel between the heat sinks 51 and 52.

As a result, air smoothly comes in and out of a lower end side and an upper end side of the flow channel.

Because of action of the lower surface 36L and the upper surface 36H described above, natural convection occurs throughout the flow channel between the heat sinks 51 and 52.

Dividing into the plurality of heat sinks 51 and 52 like the present embodiment increases heating area of the heat sinks, with which peripheral air is brought into contact, so that the heat dissipation is improved.

In addition, since a direction of division is the vertical direction, convection smoothly occurs between the heat sinks 51 and 52 adjacent to each other. As a result, it is possible to further improve the heat dissipation of the heat sinks.

Each of the heat sinks 51 and 52 divided along the vertical direction decreases in the width D as compared with the integrated heat sink 36, so that an aspect ratio increases. Accordingly, with respect of a length of a section in a longitudinal direction (vertical direction), a length of a section with a heat transfer rate lower than that of the section in the longitudinal direction can be further reduced, as compared with the integrated heat sink 36. As a result, this point also can contribute to improvement in the heat dissipation of the heat sinks.

If the width D of the respective heat sinks 51 and 52 decreases so as to be equivalent to a width of the semiconductor elements 43 corresponding to the respective heat sinks 51 and 52, it is possible to reduce a section with a lower heat transfer rate to a minimum.

The heat sink may be divided into an appropriate form in accordance with an arrangement configuration of the semiconductor elements 43. It is also possible to form six heat sinks divided along both of the vertical direction and the horizontal direction in the partition wall 32 so that the six heat sinks individually overlap with six semiconductor elements 43. The lower surface 36L or the upper surface 36H is not required to be formed in all of the heat sinks, so that the lower surface 36L or the upper surface 36H is formed in one or more of the heat sinks. For example, among heat sinks arranged in three rows of top, middle, and bottom rows, the lower surface 36L is formed in the heat sinks arranged in the bottom row, and the upper surface 36H is formed in the heat sinks arranged in the top row.

The wedge shape shown in FIG. 3A, and the one-side inclination shape shown in FIG. 3B, are applicable also to the lower end portion and the upper end portion of each of the heat sinks 51 and 52 of the present embodiment.

FIG. 4B shows an example of the heat sinks 51 and 52 that are formed in a rectangular shape in a plan view.

Each of the heat sinks 51 and 52 includes a lower surface 365 and an upper surface 366, which are orthogonal to the side surfaces 361 and 362. The lower surface 365 and the upper surface 366 are formed so as to extend linearly along the horizontal direction in the partition wall 32. According to the configuration, the partition wall 32 and the power substrate 41 erect along the vertical direction to allow natural convection to occur along the side surfaces 361 and 362 to circulate air in the circuit housing 30, as well as heat dissipation is improved due to division of the heat sink. As a result, it is possible to efficiently cool the semiconductor elements 43.

[Third Embodiment]

Next, a third embodiment of the present invention will be described.

As shown in FIGS. 5A and 5B, in the third embodiment, a projected portion 61 projecting from the partition wall 32 is provided above the heat sinks 51 and 52.

The projected portion 61 extends in the horizontal direction on the surface 32A of the partition wall 32, as shown in FIG. 5A. A dimension of the projected portion 61 in the horizontal direction is set approximately from the tip portion T of the heat sink 51 to the tip portion T of the heat sink 52.

In the present embodiment, a height of the projected portion 61 is set to be equivalent to a height of the bosses 37 to which the power substrate 41 is fixed.

The projected portion 61 includes a recessed portion 610 that has a form of being drilled from the back surface 32B of the partition wall 32, as shown in FIG. 5B. The projected portion 61 is maintained at a low temperature equivalent to that of the partition wall 32 by a sucked refrigerant flowing into the recessed portion 610 that communicates with the inside of housing 12.

According to the present embodiment, since the projected portion 61 faces an ascending current, the ascending current is cooled by the projected portion 61 to turn to descend. In this way, if an air current (Fd) descending is promoted, circulation of air in the circuit housing 30 is promoted.

In addition, since the projected portion 61 is cooled by a sucked refrigerant taken into the recessed portion 610 that is an internal space of the projected portion 61, more descending currents occur to enable the circulation of air to be further promoted.

As above, it is possible to further improve heat dissipation of the heat sinks 51 and 52, and the semiconductor elements 43.

As with the projected portion 61, the heat sinks 51 and 52 may have a form of being drilled from the back surface 32B of the partition wall 32. Accordingly, since the heat sinks 51 and 52 are cooled by the sucked refrigerant in the housing 12, it is possible to efficiently cool the semiconductor elements 43.

Instead of the hollow projected portion 61, a solid projected portion 62 shown in FIG. 6 may be formed in the partition wall 32. Here, two projected portions 62 each of which is formed in a thin plate shape are juxtaposed in the vertical direction. If an ascending current is brought into contact with the projected portions 62, the ascending current is cooled to descend. The projected portion 62 is maintained at a low temperature due to heat conduction from the partition wall 32 and heat dissipation of itself.

The projected portion 61 and the projected portions 62, described above, may be set at any height, and may project up to a position exceeding the power substrate 41. In addition, a dimension of the projected portion 61 and the projected portions 62 in the horizontal direction, and a dimension thereof in the vertical direction, also may be arbitrarily determined.

[Fourth Embodiment]

Next, a fourth embodiment of the present invention will be described.

In the fourth embodiment, members to be provided inside the circuit housing 30 are arranged by making efforts.

In a configuration shown in FIGS. 7A and 7B, the motor terminal 38 is housed in the recessed portion 610 of the projected portion 61, described above. Lead pins 381 of the motor terminal 38 are taken out through respective holes penetrating an upper surface of the projected portion 61.

Since the recessed portion 610 also serves as the terminal housing opening 39, the number of members occupying the inside of the circuit housing 30 decreases to allow an air current to smoothly circulate in the circuit housing 30. As a result, it is possible to enhance the cooling effect.

In addition, in a configuration shown in FIG. 8, the bosses 37 (fixed portions) for fixing the power substrate 41 are arranged by making efforts. There are two ideas for that, and first boss portions 37' (female screw parts) are formed integrally with the upper end portion and the lower end portion of each of the heat sinks 51 and 52. Next, the bosses 37 are arranged so as to be adjacent to the projected portion 61, and are formed integrally with the projected portion 61.

Only one of the bosses 37 and the boss portions 37' may be provided.

As described above, since the bosses 37 and the boss portions 37' are integrated with the heat sinks 51 and 52 or the projected portion 61, it is possible to reduce the number of members occupying the inside of the circuit housing 30.

In addition, since the bosses 37 and the boss portions 37' are thermally connected to the heat sinks 51 and 52, and the projected portion 61 to increase a heat capacity, heat dissipation of the heat sinks 51 and 52, and the projected portion 61 is improved. Further, since heat transfer from the power substrate 41 through the bosses 37 and the boss portions 37' can be expected, it is possible to contribute to improvement in the heat dissipation of the semiconductor elements 43.

In each of the embodiments described above, although there is shown the electric compressor that compresses a refrigerant, other than that, the present invention is widely applicable to a variety of apparatuses, such as an electric compressor that compresses air, and an electric pump.

It is possible to select from the configurations shown above, and to appropriately modify them for another configuration, within a range without departing from the essence of the present invention.

REFERENCE SIGNS LIST

1 electric compressor
10 motor
11 scroll compression mechanism
12 housing
13 rotor
14 stator
15 rotating shaft
16 fixed scroll
17 turning scroll
18 eccentric pin
19 bushing
21 suction pipe
22 cover member
23 discharge pipe
30 circuit housing
32 partition wall
32A surface
32B back surface
33 sidewall
34 circuit cover
36 heat sink
36H upper surface
36L lower surface
37 boss
38 motor terminal
39 terminal housing opening
40 circuit unit
41 power substrate
42 control substrate
43 semiconductor element
43A element body
43B radiating member
51, 52 heat sink
61, 62 projected portion
361, 362 side surface
363 lower end portion
364 upper end portion
410 area
610 recessed portion
F1 to F4 air current
D width
T tip portion

The invention claimed is:

1. An apparatus comprising:
   an apparatus body;
   a body housing that houses the apparatus body;
   a circuit unit including a circuit board that drives and controls the apparatus body; and
   a circuit housing that houses the circuit unit and that is integrated with the body housing, wherein a heat sink is provided on a circuit unit side of a partition wall so as to be brought into contact with an element of the circuit board, the partition wall erecting along a vertical direction or a substantially vertical direction to separate the inside of the body housing from the inside of the circuit housing, and wherein the heat sink has an upper end portion and a lower end portion at least one of whose width gradually decreases to reach a tip portion.

2. The apparatus according to claim 1, wherein the heat sink has a dimension in the vertical direction that is longer than a dimension in a direction intersecting the vertical direction.

3. The apparatus according to claim 1, wherein a plurality of the elements is arranged on the circuit board at least in a horizontal direction, and wherein the heat sink is provided for each of blocks into which an area where the elements are arranged is divided along the vertical direction.

4. The apparatus according to claim 1, wherein a projected portion is formed in the partition wall so as to project above the heat sink toward the circuit unit.

5. The apparatus according to claim 4, wherein the projected portion is formed so as to include a recessed portion that communicates with the inside of the body housing.

6. The apparatus according to claim 5, wherein in the recessed portion, a terminal connecting the circuit board and the apparatus body is housed.

7. The apparatus according to claim 1, wherein a fixed portion for fixing the circuit board to the partition wall is formed integrally with at least one of the heat sink and the projected portion.

8. The apparatus according to claim 1, wherein the apparatus body includes a motor, and a compression mechanism that is driven and controlled through the motor and that compresses a refrigerant to be sucked into the body housing.

* * * * *